US011777398B2

(12) United States Patent
Iadicicco et al.

(10) Patent No.: US 11,777,398 B2
(45) Date of Patent: Oct. 3, 2023

(54) PRE-CHARGING BOOTSTRAPPED FET GATE

(71) Applicant: Apple Inc., Cupertino, CA (US)

(72) Inventors: Giulio Maria Iadicicco, Munich (DE); Michael Couleur, Rottach-Egern (DE); Siarhei Meliukh, Munich (DE)

(73) Assignee: Apple Inc., Cupertino, CA (US)

( * ) Notice: Subject to any disclaimer, the term of this patent is extended or adjusted under 35 U.S.C. 154(b) by 338 days.

(21) Appl. No.: 17/144,902

(22) Filed: Jan. 8, 2021

(65) Prior Publication Data

US 2022/0224216 A1     Jul. 14, 2022

(51) Int. Cl.
*H02M 1/08* (2006.01)
*H03K 17/687* (2006.01)
*H02M 3/158* (2006.01)
*H03K 17/06* (2006.01)
*H02M 1/00* (2006.01)

(52) U.S. Cl.
CPC ............. *H02M 1/08* (2013.01); *H02M 3/158* (2013.01); *H03K 17/6872* (2013.01); *H02M 1/0006* (2021.05); *H03K 17/063* (2013.01)

(58) Field of Classification Search
None
See application file for complete search history.

(56) References Cited

U.S. PATENT DOCUMENTS

| 5,914,867 A | * | 6/1999 | Pascucci | H02M 3/07 363/60 |
| 9,000,745 B2 | | 4/2015 | Shi | |
| 9,531,373 B2 | | 12/2016 | Sicard et al. | |
| 11,063,516 B1 | * | 7/2021 | Kim | H02M 3/07 |
| 2013/0049847 A1 | * | 2/2013 | Glibbery | H03K 17/063 327/543 |
| 2020/0035179 A1 | * | 1/2020 | Chen | G09G 3/3648 |
| 2020/0169168 A1 | | 5/2020 | Balaz et al. | |

FOREIGN PATENT DOCUMENTS

| CN | 114389450 | * | 4/2022 | ............. H02M 3/158 |
| WO | WO-2020159640 A1 | * | 8/2020 | ............. H02M 1/08 |

* cited by examiner

*Primary Examiner* — Matthew V Nguyen
(74) *Attorney, Agent, or Firm* — Kowert, Hood, Munyon, Rankin & Goetzel, P.C.; Erik A. Heter; Dean M. Munyon (57) ABSTRACT

Circuitry for bootstrapping and precharging a gate of a field-effect transistor (FET) is disclosed. In one embodiment, an apparatus includes a first transistor coupled to a switching node and further coupled to receive a supply voltage from a supply voltage node, and a second transistor coupled between the switching node and a ground node, wherein the first and second transistors are of a same type. A precharge circuit is configured to precharge a gate terminal of the first transistor to a voltage that is less than a supply voltage on the voltage supply node. The apparatus also includes a bootstrap circuit. Subsequent to precharging the gate terminal of the first transistor, the bootstrap circuit is configured to cause activation of the first transistor by charging the gate terminal to a voltage greater than the supply voltage.

20 Claims, 10 Drawing Sheets

PRE-CHARGING BOOTSTRAPPED FET GATE

BACKGROUND

Technical Field

This disclosure is directed to electronic circuits, and more particularly, to circuits for bootstrapping a field effect transistor (FET).

Description of the Related Art

Bootstrapping is a technique used in electronic circuits in which an NMOS device is used as a high side/pull-up device rather than a PMOS device. In standard CMOS circuit, PMOS devices are used as the pull-up transistor, in large part due to the threshold voltage requirements for PMOS and NMOS devices. When an NMOS device is used as a pull-up device, extra circuitry is provided to drive its gate voltage high enough to turn on to create the pull-up path. This type of circuitry is referred to as a bootstrap circuit. Typical bootstrap circuits include a capacitor, sometimes referred to a fly capacitor, which has a capacitance value that is significantly greater than the gate capacitance of the corresponding NMOS device.

SUMMARY

Circuitry for bootstrapping and precharging a gate of a field-effect transistor (FET) is disclosed. In one embodiment, an apparatus includes a first transistor coupled to a switching node and further coupled to receive a supply voltage from a supply voltage node. The apparatus further includes a second transistor coupled between the switching node and a ground node, wherein the first and second transistors are of a same type. A precharge circuit is configured to precharge a gate terminal of the first transistor to a voltage that is less than a supply voltage on the voltage supply node. The apparatus also includes a bootstrap circuit. Subsequent to precharging the gate terminal of the first transistor, the bootstrap circuit is configured to cause activation of the first transistor by charging the gate terminal to a voltage greater than the supply voltage.

In one embodiment, both the first and second transistors are NMOS transistors, with the first NMOS transistor implemented to, when active, provide a pull-up path between the switching node and the voltage supply node. The bootstrap circuit may thus drive the gate voltage of the first transistor greater than that of the supply voltage such that the threshold voltage of the first transistor may be sufficient for activation. However, by using the precharge circuit to precharge the gate terminal of the first transistor, a capacitor used in implementing the bootstrap circuit may be significantly smaller than those of previous bootstrap circuits.

BRIEF DESCRIPTION OF THE DRAWINGS

The following detailed description makes reference to the accompanying drawings, which are now briefly described.

DETAILED DESCRIPTION OF EMBODIMENTS

The present disclosure is directed to bootstrapping of transistors in electronic circuits. In some circuits, it is desirable to use an NMOS transistor in the place of a pull-up transistor for various reasons, such as better pull-up strength. This may be particularly useful in some applications, such as in implementing a high side device in a power converter. However, due to the inverting nature of CMOS, using an NMOS transistor in place of a PMOS presents certain challenges. In particular, to turn on an NMOS transistor used in a pull-up configuration, the gate terminal is driven to a voltage that is greater than a supply voltage coupled to, e.g., a drain terminal of the NMOS transistor.

To perform bootstrapping, extra circuitry is implemented. Typically, a bootstrapping circuit includes a capacitor and charging circuitry. The charging circuitry charges the capacitor while the bootstrapped transistor is inactive. Then, to activate the transistor, the gate terminal thereof is coupled to the capacitor. The capacitor transfers charge to the gate terminal and thus raises its voltage to a level sufficient for activation. In typical implementations, the capacitance used for the bootstrap circuit capacitor is significantly larger than the gate capacitance of the transistor. Large capacitors consume a significant amount of area on an integrated circuit die.

The present disclosure makes use of the insight that, if the voltage of the gate terminal is sufficiently high before activation, a smaller capacitor could be used in the bootstrap circuit. Accordingly, the circuit of the present disclosure implements a precharge circuit that works in conjunction with bootstrap circuit. In particular, the precharge circuit may precharge the gate terminal of the bootstrapped transistor to a voltage that is somewhat closer to its activation voltage. Thus, a smaller capacitor may be able to accumulate a sufficient amount of charge such that, when connected to the gate terminal of the bootstrapped transistor, the increase in voltage needed to turn on the bootstrapped transistor may be less than prior art bootstrap circuits. Furthermore, the use of a smaller capacitor may lead to reduced area consumption.

The discussion below begins with a basic overview of one embodiment of a circuit that includes both bootstrap and precharge circuitry working with one another, followed by discussion of operation of one particular embodiment of such a circuit. Thereafter, examples of power converters in which the bootstrap and precharge circuit may be implemented are discussed. Discussion of a method by which a bootstrap and precharge circuit may work together follows, and the description concludes with discussion of an example system.

Figure 1:
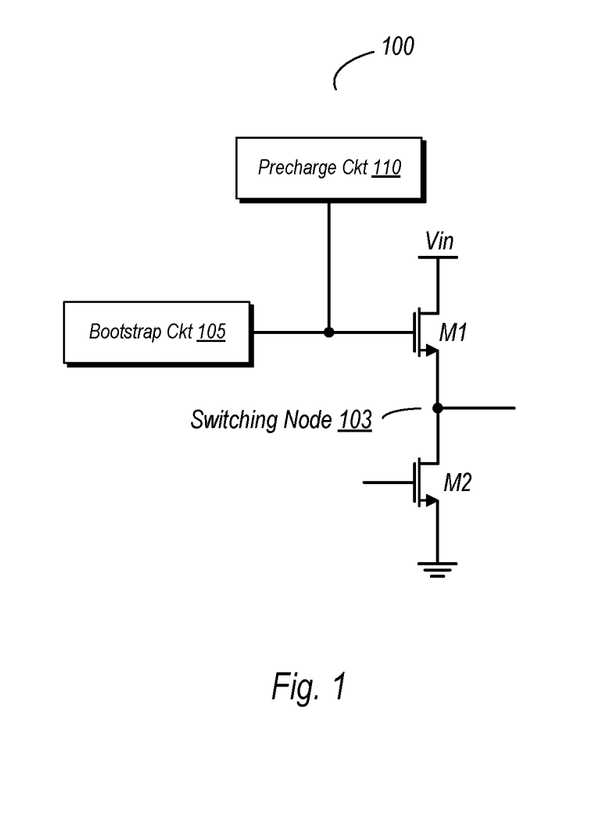
FIG. 1 is a diagram of one embodiment of a circuit having precharge and bootstrap circuitry.

Circuitry Using Bootstrap and Precharge Circuit:

FIG. 1 is a diagram of one embodiment of an apparatus in which a bootstrap circuit and a precharge circuit work together in a bootstrapping operation for a transistor. In the embodiment shown, transistors M1 and M2 of apparatus 100 are coupled to one another at a switching node 103, which may be pulled up toward an input voltage, Vin (when M1 is active) or pulled down toward ground (or Vss) when M2 is active. Both M1 and M2 are implemented as NMOS transistors in this embodiment. Since an NMOS transistor is used as the pullup transistor M1 in this embodiment instead of a PMOS transistor, bootstrap circuitry is provided to drive the gate terminal of M1 to a voltage sufficient for activation. In particular, the voltage on the gate terminal of M1 may be drive to a value greater than Vin for activation.

Bootstrap circuit 105 in the embodiment shown is configured to drive the voltage on the gate terminal of M1 to a voltage sufficient for activation. As will be discussed below, bootstrap circuit 105 includes a capacitor and additional circuitry for charging the capacitor. The capacitor may be decoupled from the gate terminal of M1 during charging. When activating M1, the capacitor may be connected to its gate terminal. When connected to the gate terminal of M1, some of the charge from the capacitor is transferred. This transfer of charge raises the voltage on the gate terminal of M1 to a value greater than M1 and to a level sufficient for activation.

In order to keep the capacitor relatively small, apparatus 100 also includes a precharge circuit 110. For at least a portion of time the capacitor is charging, precharge circuit 110 performs a precharge to raise the voltage of the gate terminal of M1. This may result in the voltage on the M1 gate terminal being raised to a level that is less than but close to that which is sufficient for activation. Accordingly, the amount of additional voltage to reach activation for M1 is less relative to embodiments in which no precharge circuit is implemented. Accordingly, bootstrap circuit 105 may be implemented using a smaller capacitor, as the amount of charge that needs to be transferred onto the gate terminal of M1 is less, due to the precharge operation, than in embodiments in which no precharge is performed.

Figure 2:
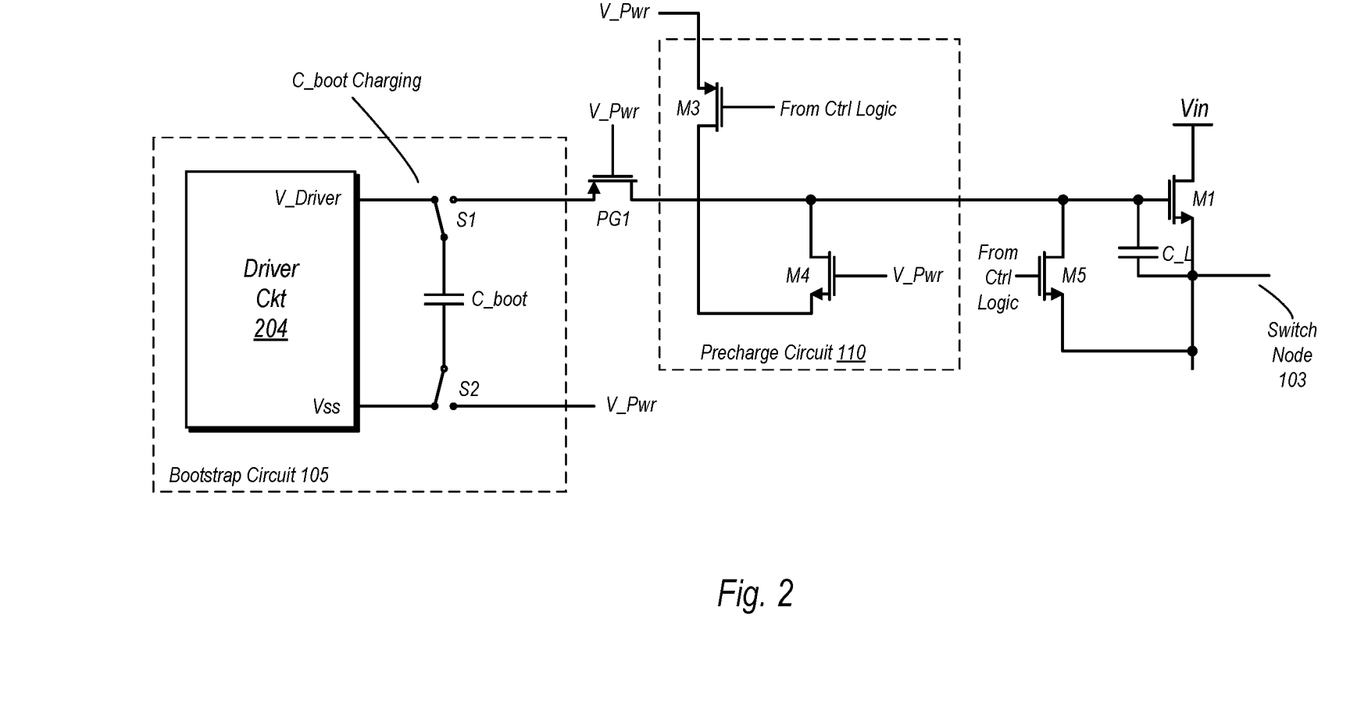
FIG. 2 is a schematic diagram of one embodiment of a circuit having precharge and bootstrap circuitry.

FIG. 2 further illustrates a circuit in that includes a bootstrap circuit and a precharge circuit working in conjunction with one another to raise the gate voltage on an NMOS transistor used as a pull-up device. For the sake of simplicity, the pull-down device is not shown here. Transistor M1 as shown here is implemented as a pull-up transistor, coupled between switch node 103 and an input supply voltage, Vin, received via a supply voltage node. A capacitor C_L as shown here is representative of the gate capacitance of ml. A transistor M5 coupled between the gate terminal of M1 and the switch node 103 implements a discharge circuit. The gate terminal of M5 may be coupled to a control logic circuit that activates this device to discharge the gate terminal of M1 upon deactivation of that device.

In the embodiment shown, bootstrap circuit 105 includes a capacitor, C_boot, a driver circuit 204, and a pair of switches S12 and S2. Both of switches S1 and S2 are single throw, double pole switches. To charge capacitor C_boot, switch S1 couples a first terminal of the capacitor to a voltage V_driver generated by driver circuit 204, while S2 coupled a second terminal of the capacitor to a reference node, Vss. When connected as shown in FIG. 1, C_boot is charged, with a voltage potential between its terminals equal to V_Driver−Vss during charging. A passgate, PG1, is coupled between bootstrap circuit 105 and the gate terminal of M1. The gate terminal of PG1 is hardwired to a voltage node, V_Pwr in this particular embodiment. Driver circuit in the embodiment shown may be implemented using any suitable circuitry or circuit configuration. For example, V_Driver may be generated using a bandgap circuit, supplied from another power supply (e.g., an analog power supply), or any other suitable mechanism.

Precharge circuit 110 in the embodiment shown is configured to precharge the gate terminal of M1. In the embodiment shown, precharge circuit 110 includes a PMOS transistor M3 and an NMOS transistor M4. The precharge operation may be initiated by activating M3. The source terminal of M3 is coupled to the voltage node V_Pwr, which is a supply voltage node. The source terminal of M4 is coupled to the drain terminal of M3, while the drain terminal of M4 is coupled to the gate terminal of M1. The gate terminal of M4 is also coupled to the voltage node V_Pwr. The precharge operation may be initiated by activating M3. When M3 is active, the voltage on the source terminal of M4 (coupled to the M3 drain terminal) is such that M4 is activated due to its gate being hardwired to V_Pwr. Accordingly, the gate terminal of M1 is precharged to a voltage that is less than V_Pwr by the threshold voltage of M4.

Figure 3:
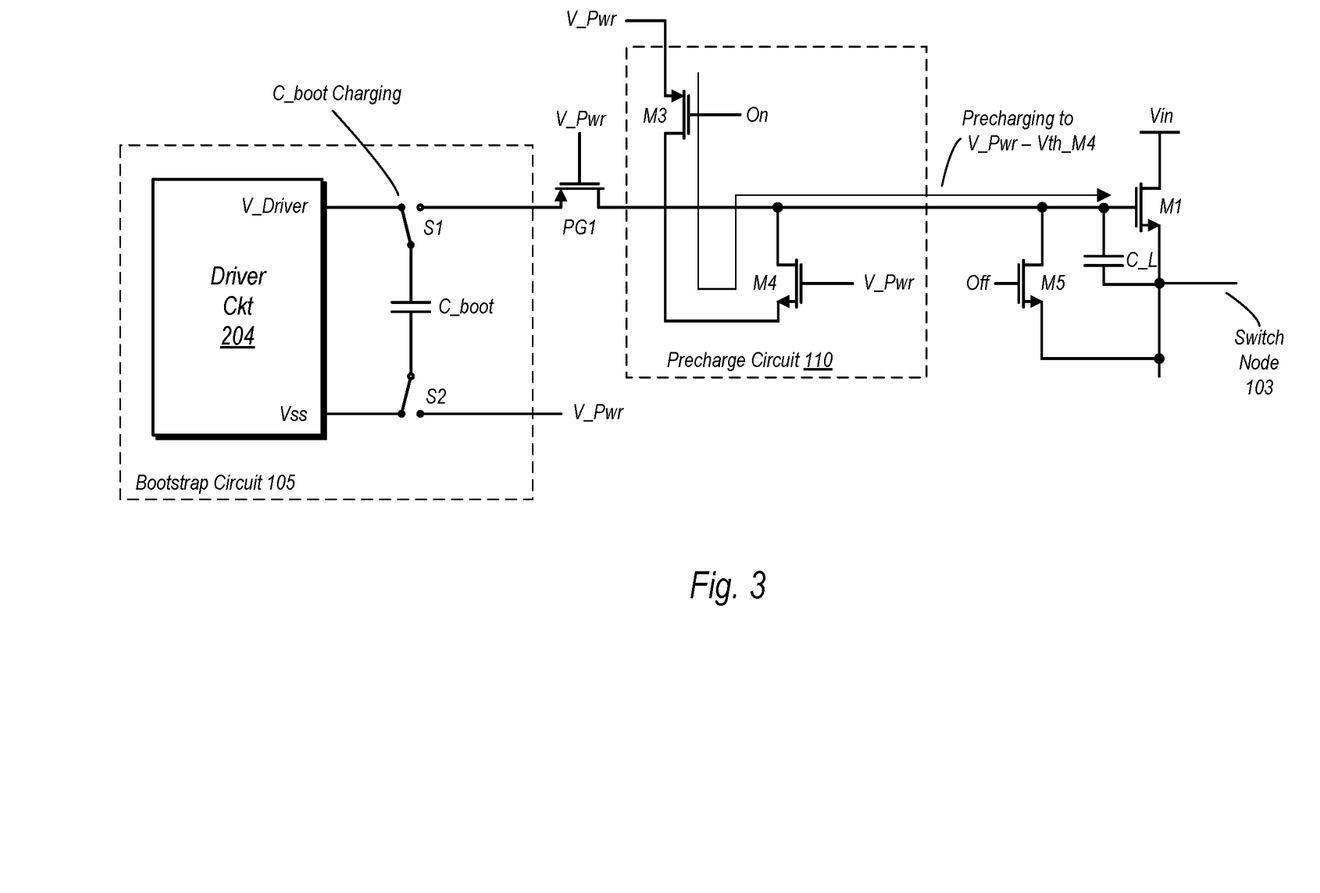
FIG. 3 is a schematic diagram further illustrating operation of one embodiment of a circuit having precharge and bootstrap circuitry.

FIG. 3 further illustrates the precharge operation. In the example shown, the precharge of the M1 gate terminal is performed concurrently with the charging of capacitor C_boot in bootstrap circuit 105. Generally speaking, the charging of capacitor C_boot and the precharging of the M1 gate terminal may overlap, although the charging of the capacitor C_boot may occur at other times when the precharge operation is not occurring (e.g., it may begin prior to the precharging).

As noted above, the precharging operation occurs when transistor M3 is activated. When the ON signal is provided (e.g., as a logic low) to the gate terminal of M3, this PMOS device is activated to create a signal path between V_Pwr and the source terminal of M4. The voltage on the source terminal of M4 is a threshold voltage less than V_Pwr at this time. Accordingly, M4 is activated, and the gate terminal of M1 is precharged to a voltage expressed as V_Pwr−Vth_M4, where the latter term is the threshold voltage of M4. The voltage on the gate terminal of M1, while insufficient to cause its activation, is nevertheless closer to its threshold than it would be in the absence of the precharge.

Figure 4:
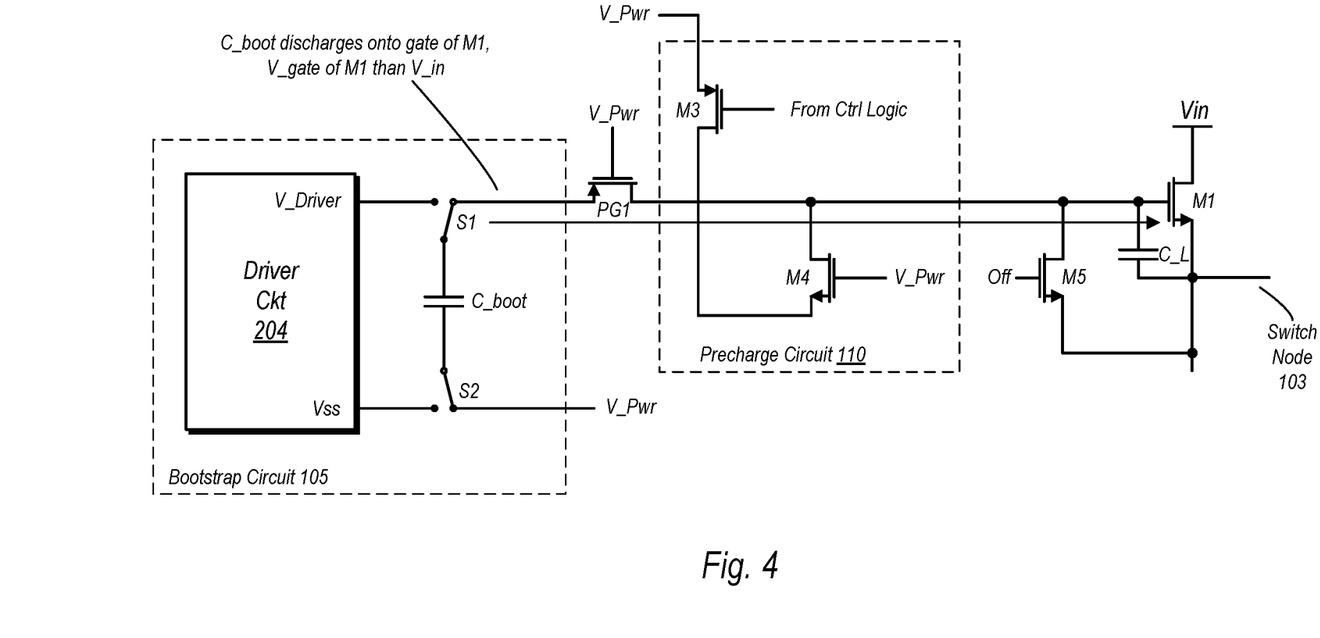
FIG. 4 is a schematic diagram further illustrating operation of one embodiment of a circuit having precharge and bootstrap circuitry.

In FIG. 4, the activation of M1 occurs when the respective positions of switches S1 and S2 are changed. In the embodiment shown, switch S1 couples the first terminal of C_boot to the source terminal of passgate PG1. Meanwhile switch S2 coupled the second terminal of C_boot to V_Pwr. At this point in the operation, the voltage present on the source terminal of PG1 is V_Pwr+V_Driver. This results in the activation of PG1 and raises the M1 gate terminal voltage to a value sufficient for activation. The total voltage on the gate terminal at this point in the operation can be expressed as follows:

$$V\_Gate\_M1 = (V\_Pwr + V\_Driver)\frac{C\_boot}{C\_boot + C\_L} + $$
$$(V\_Pwer - Vth\_M4)\frac{C\_L}{C\_boot + C\_L}.$$

Thus, when the gate voltage is at the level expressed in the equation above, M1 is activated and switching node 103 is pulled up toward Vin. De-activation of M1 can subsequently be accomplished by de-activating M3 (thereby cutting off the precharge path) and positioning switches S1 and S2 back to the charging position. Thereafter, the voltage on the gate terminal of M1 discharges through the discharge path that includes M5 (when activated by control logic).

Figure 5:
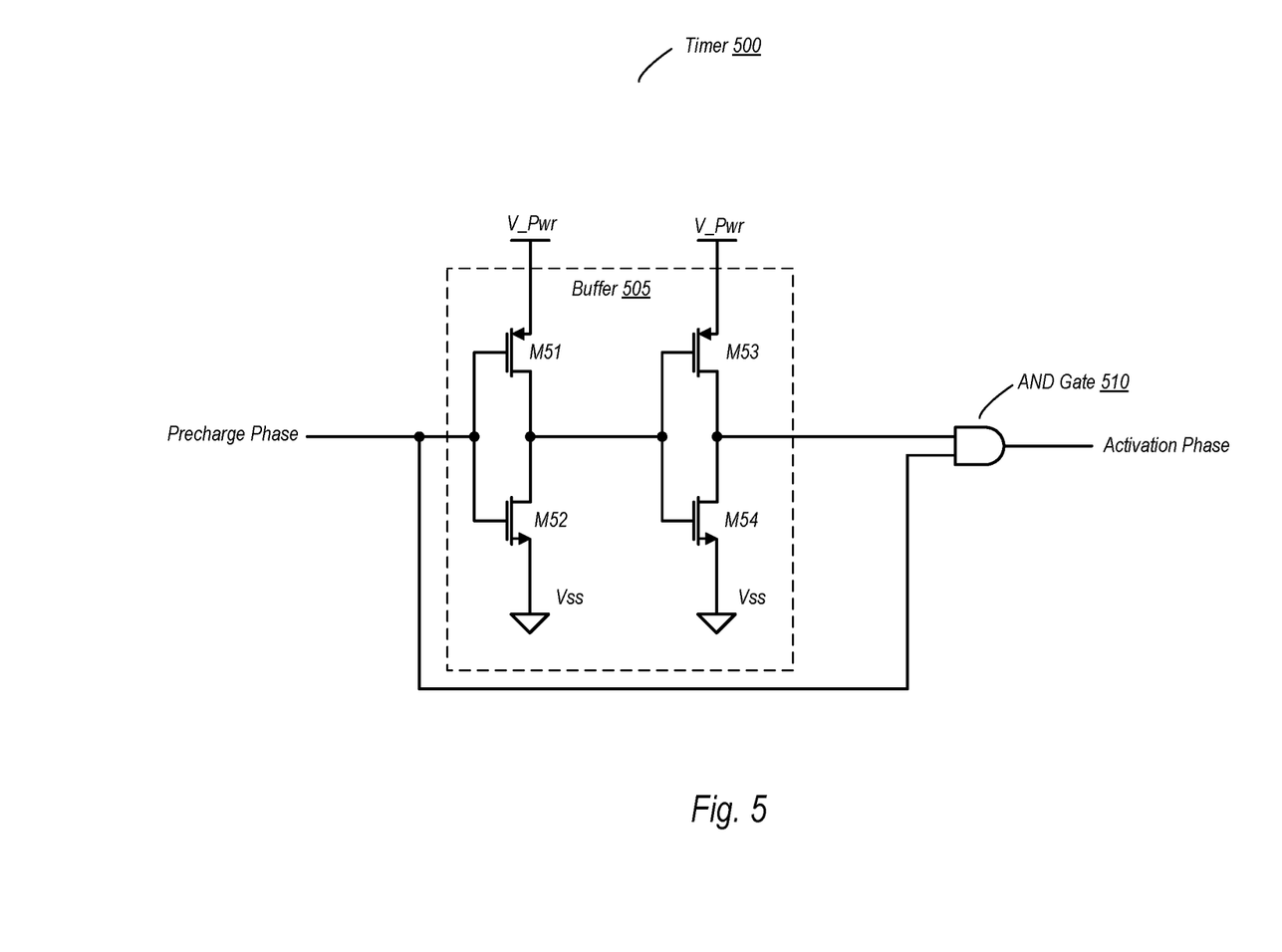
FIG. 5 is a schematic diagram of a timing circuit used in one embodiment of a control circuit.

In some embodiments, a timer may be implemented to control the transition into and out of the precharge phase and into the activation phase of M1. FIG. 5 illustrates one embodiment of a timing circuit that may be implemented within a control circuit to control this timing. In the embodiment shown, timer 500 includes a buffer 505 and an AND gate 510. Buffer 505 in the embodiment shown includes a pair of inverters coupled in series. A first inverter is implemented by transistors M51 and M52, with the second inverter implemented by transistors M53 and M54. A control signal may be input into timer 500 to initiate the precharge phase. The control signal is received directly on one input of AND gate 510, and additionally received on the input of buffer 505. The output of buffer 505 is a delayed version of the control signal. When the delayed version and the original version are both logic ones, AND gate 510 outputs a second control signal that may be used to cause initiation of the activation phase for transistor M1.

The length of the time the control signal is input into timer 500 at the beginning of the precharge phase may be set to ensure that the gate terminal of M1 is properly precharged when AND gate 510 outputs the second control signal. In order to match the desired time, the timer may be fabricated using the same type of components as those controlling the charging phase. That is, the transistors of the buffer and those used to implement AND gate 510 may be substantially matched to those of the transistors implementing the precharge circuit.

Timer circuit 500 is one example of a timer that may be used in the control of transition between the various phases of operation of the circuits discussed herein. However, many other types of timers are possible and contemplated. Some timer embodiments may include counters and may use a clock signal. Embodiments that utilize delay circuits are also possible and contemplated. Generally speaking, in embodiments in which a timer circuit is used, and suitable mechanism for implementation of the same may be used to carry out the various phase transitions.

Figure 6:
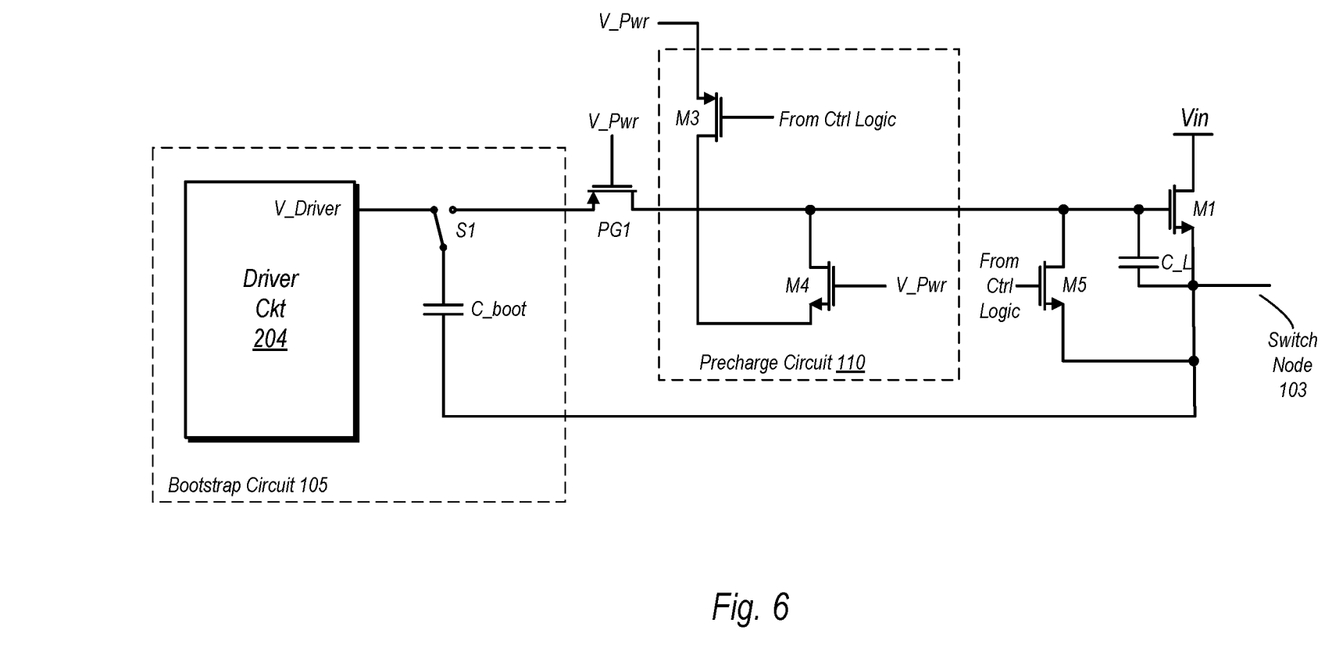
FIG. 6 is schematic diagram of another embodiment of a circuit having precharge and bootstrap circuitry.

FIG. 6 is a schematic diagram of an embodiment illustrating another arrangement of bootstrap and precharge circuits. In the embodiment shown, most of the circuitry is arranged in the same manner as the embodiments shown in FIGS. 2-4. However, the second terminal of C_boot, rather than being coupled to Vss during charging, is instead hardwired to the switch node 103. When C_boot is charging, the voltage across this capacitor is the difference between V_driver and the voltage on switching node 103. When the precharge circuit 110 precharges the gate terminal of M1, the voltage on the switching node rises. When this voltage has reached a sufficient level, switch S1 couples the first terminal of C_boot to the source terminal of passgate PG1, and thus the voltage on the gate germinal of M1 is raised sufficiently to cause activation. Switch S1 may be controlled by a control logic circuit in this embodiment similar to the other embodiments discussed above. The control logic circuit may include circuitry to sense when the voltage on the switching node has reached a sufficient level, and may cause a change of the switch position of S1.

Figure 7:
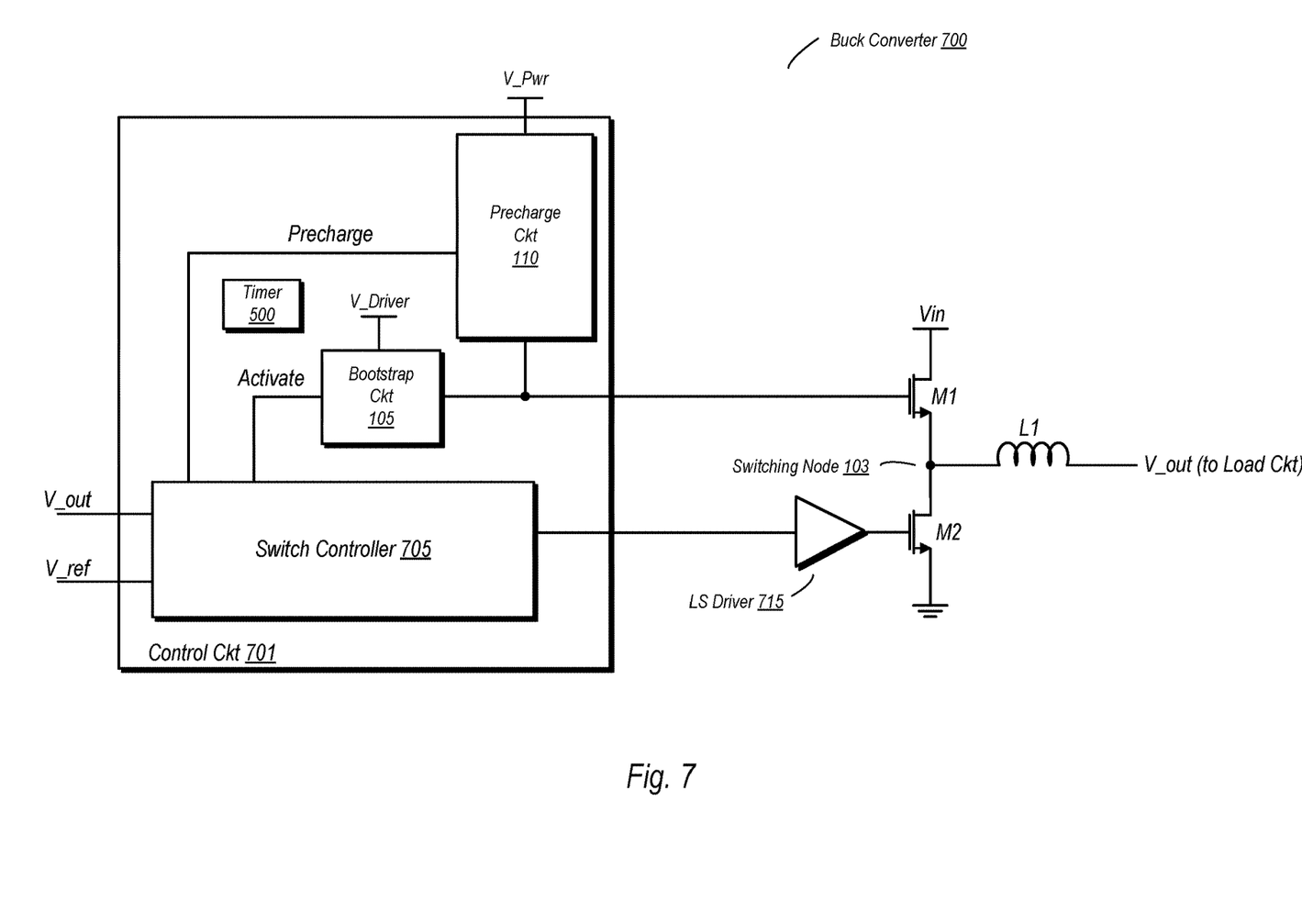
FIG. 7 is a schematic diagram of one embodiment of a power converter having precharge and bootstrap circuits.

Power Converters with Bootstrapped Transistors:

FIG. 7 is an example embodiment of a power converter in which the high side device, M1 as shown here, is a bootstrapped transistor. More particularly, the embodiment shown here is a buck converter that is configured to generate a regulated output voltage that is less than the value of the input voltage.

In the embodiment shown, buck converter 700 includes a control circuit 701 that is arranged to alternately activated transistors M1 and M2. A driver circuit, low side (LS) driver 715, is coupled between control circuit 701 and the gate terminal of M2 to provide additional drive strength. The gate terminal of transistor M1 in the embodiment shown is coupled to a precharge circuit and a bootstrap circuit, both of which may function in accordance with those discussed above. An inductor L1 is coupled to the switching node 103. The voltage may be generated by alternately activating and deactivating transistors M1 and M2 in accordance with buck converter operation. The output node of buck converter 700, V_out, may be coupled to a load circuit (not shown here) as well as to a capacitor (also not shown here).

Control circuit 701 in the embodiment shown includes switch controller 705, bootstrap circuit 105, precharge circuit 110, and an optional timer 500 (which may function in accordance with the embodiment discussed above). Switch controller 705 is configured to receive the output voltage, V_out (or alternatively, a feedback voltage generated based on the output voltage), as well as a reference voltage, V_ref. Based on a comparison of these two voltages, switch controller 705 may control both the frequency and the duty cycle of switching for transistors M1 and M2. In some embodiments, switch controller may cause operation in a pulse frequency modulation (PFM) mode or a pulse width modulation (PWM) mode, depending on the particular operating conditions, including the current demand of the load circuit. Based on these factors, switch controller 705 may generate control signals to activate and deactivate transistors M1 and M2. Activation of M1 in this embodiment includes generation of the precharge and activate signals, which are received by precharge circuit 110 and bootstrap circuit 105, respectively. These circuits may work in a manner similar to those discussed above, and may include a charging phase (in which the capacitor of the bootstrap circuit is charged), a precharge phase (in which the gate terminal of M1 is precharged), and an activation phase (in which bootstrap circuit 105 elevates the gate voltage of M1 to a sufficient value for activation. Timer 500 may control the timing of transitions between the precharge and activation phases.

Figure 8:
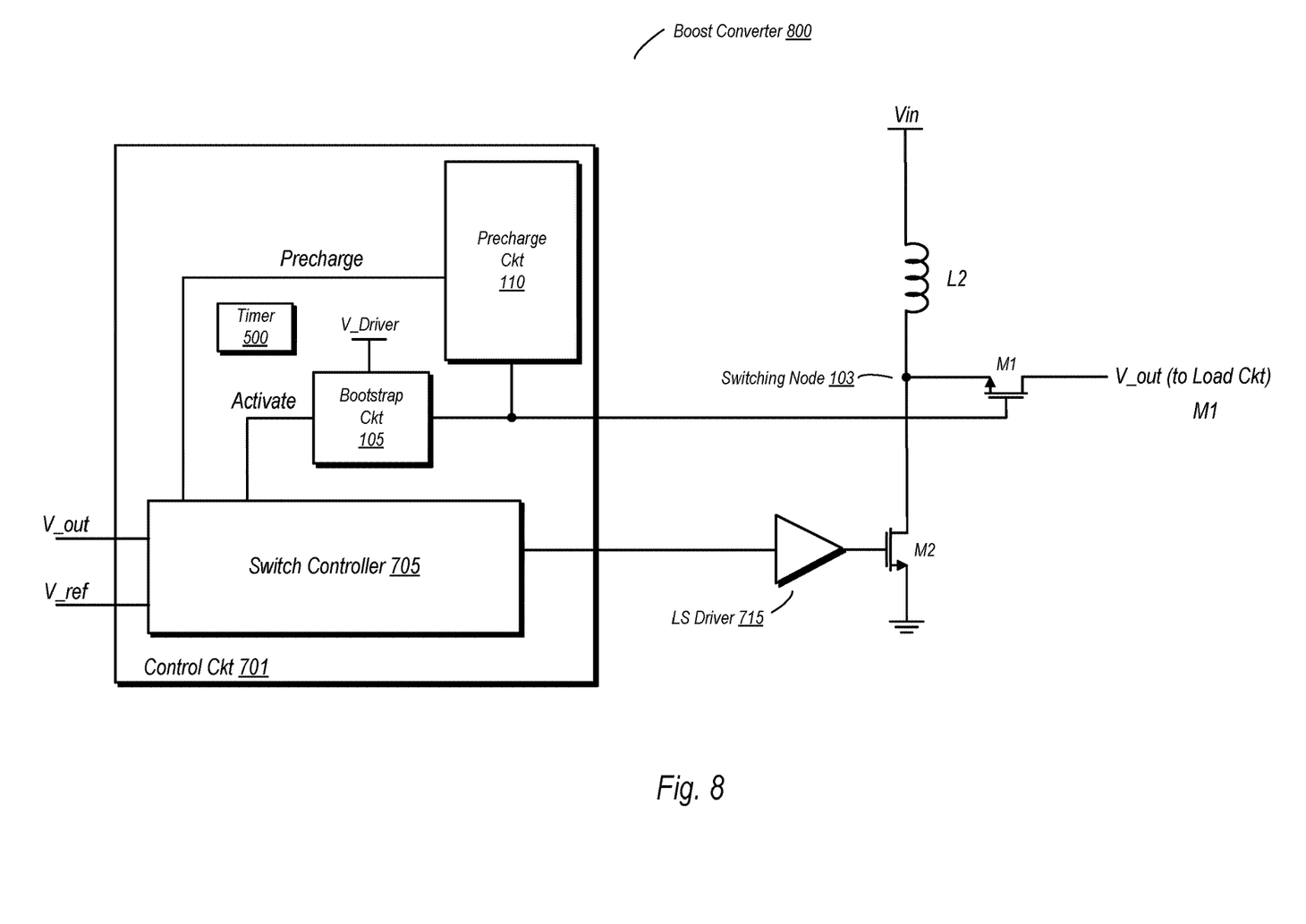
FIG. 8 is a schematic diagram of another embodiment of a power converter having precharge and bootstrap circuits.

FIG. 8 is a diagram of a boost converter that includes a bootstrapped high side transistor. In this embodiment, the inductor L2 is coupled between the switching node and the input voltage source, Vin. The high side transistor, M1, is coupled to the switching node by its source terminal, with its drain terminal coupled to the output node, V_out. In boost converter 800, the output voltage provided on V_out is greater than the input voltage provided on Vin.

Control circuit 701 in the embodiment shown is arranged in a similar manner as that shown in FIG. 7. Accordingly, switch controller 705 may generate control signals to activate and deactivate transistor M1 and M2. In activating transistor M1, switch controller 705 may generate control signals to operation of bootstrap circuit 105 and precharge circuit 110 in the charging, precharging, and activation phases as discussed above.

Figure 9:
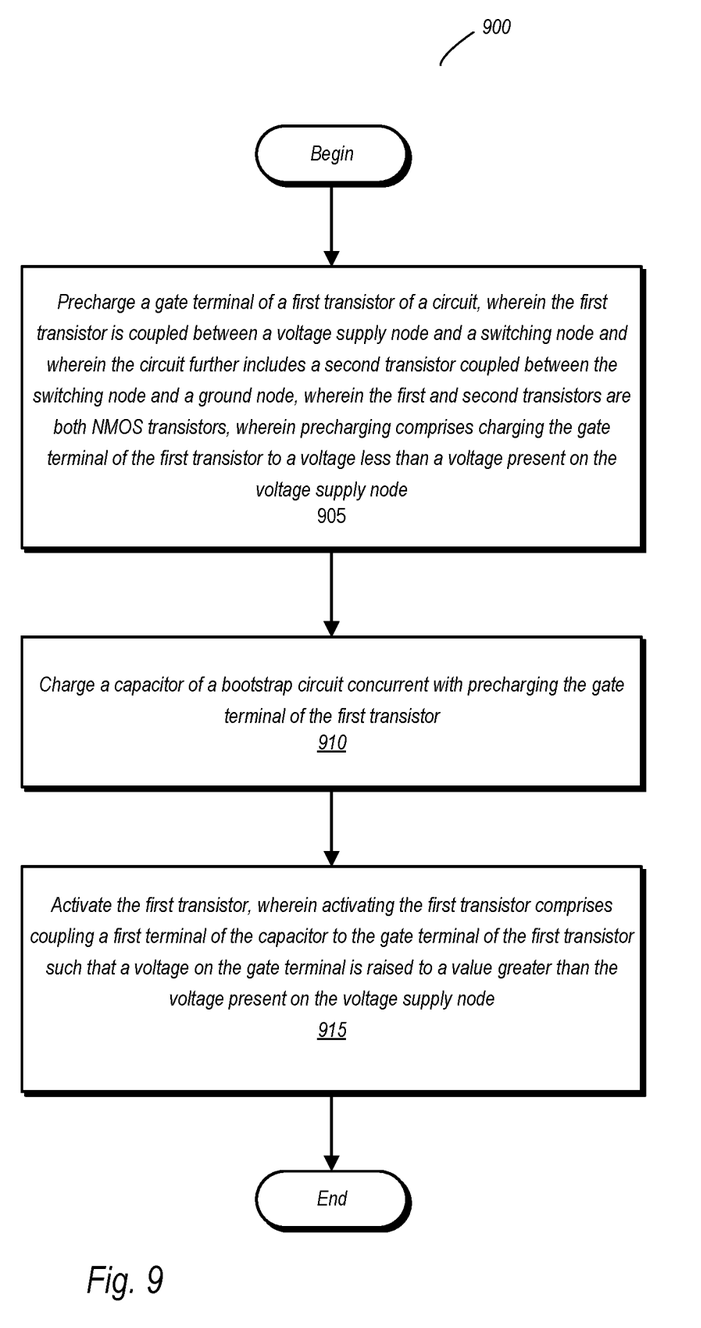
FIG. 9 is a flow diagram of one embodiment of a flow diagram for operating circuitry with precharge and bootstrap circuits.

Flow Diagram:

FIG. 9 is a flow diagram of one embodiment of a flow diagram for operating circuitry with precharge and bootstrap circuits. Method 900 may be performed using any of the various circuit embodiments discussed above. Furthermore, embodiments capable of carrying out Method 900 but not explicitly disclosed herein are also considered to fall within the scope of this disclosure.

Method 900 includes precharging a gate terminal of a first transistor of a circuit, wherein the first transistor is coupled between a voltage supply node and a switching node and wherein the circuit further includes a second transistor coupled between the switching node and a ground node, wherein the first and second transistors are both NMOS transistors, wherein precharging comprises charging the gate terminal of the first transistor to a voltage less than a voltage present on the voltage supply node (block 905). The method further includes charging a capacitor of a bootstrap circuit concurrent with precharging the gate terminal of the first transistor (block 910). Thereafter, during a third phase of operation, the method includes activating the first transistor, wherein activating the first transistor comprises coupling a first terminal of the capacitor to the gate terminal of the first transistor such that a voltage on the gate terminal is raised to a value greater than the voltage present on the voltage supply node.

In various embodiments, charging the capacitor comprises coupling the first terminal of the capacitor to a driver circuit and a second terminal of the capacitor to a reference node. Activating the first transistor further comprises changing respective positions of first and second switches, wherein changing the respective position of the second switch comprises coupling the second terminal of the capacitor to the voltage supply node.

Precharging the gate terminal of the first capacitor comprises activating a PMOS transistor having a source terminal coupled to the voltage supply node. Precharging the gate terminal also includes activating an NMOS transistor coupled between a drain terminal of the PMOS transistor and a gate terminal of the first transistor, wherein activating the PMOS and NMOS transistors causes the gate terminal to be precharged to a voltage that is a threshold voltage of the NMOS transistor less than the voltage present on the supply voltage node. A control circuit performs the controlling of an amount of precharging of the gate terminal of the first transistor, and further configured to cause the activating of the first transistor in response to completing of the precharging.

Example System

Figure 10:
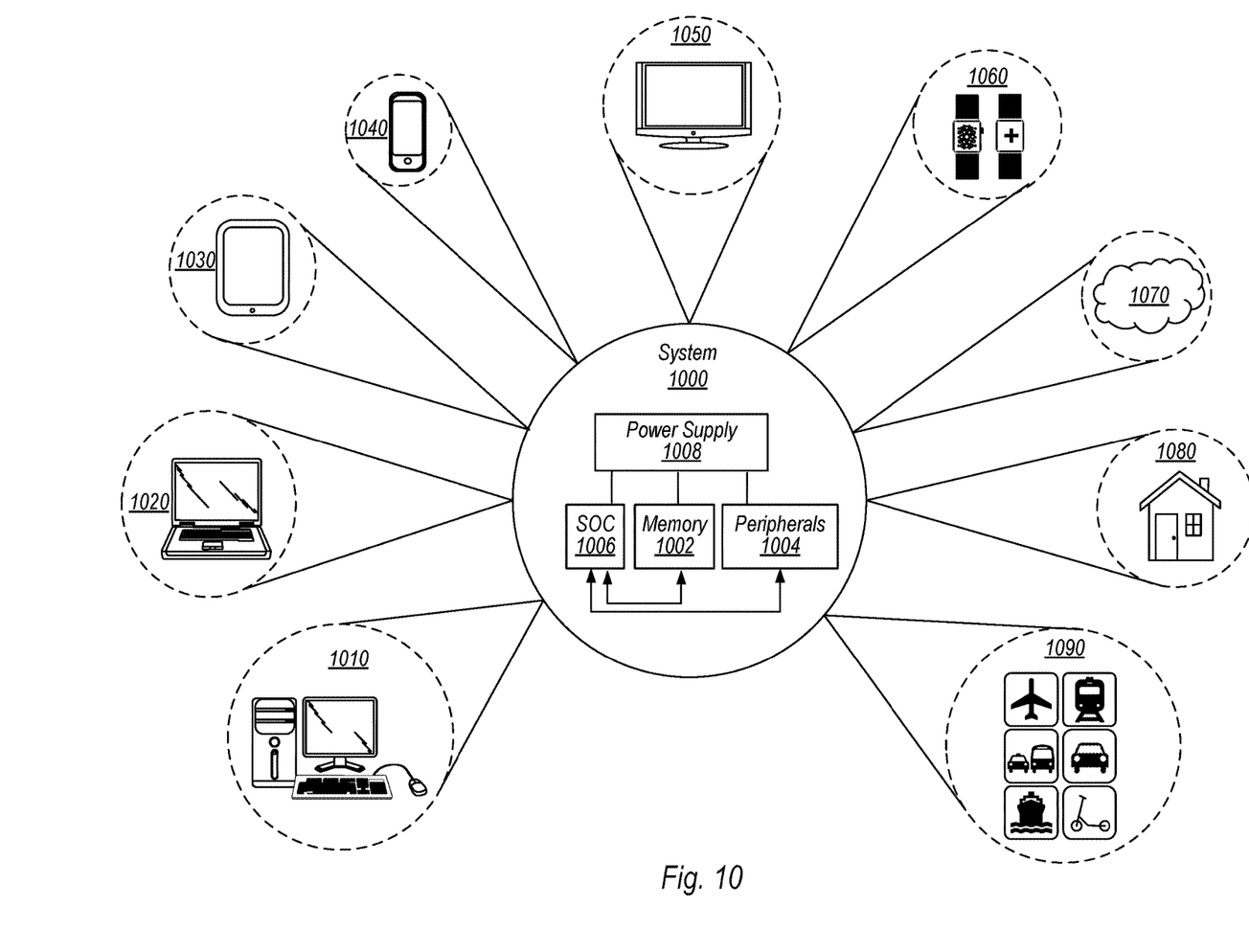
FIG. 10 is a diagram of one embodiment of an example system.

Turning next to FIG. 10, a block diagram of one embodiment of a system 1000 is shown that may incorporate and/or otherwise utilize the methods and mechanisms described herein. In the illustrated embodiment, the system 1000 includes at least one instance of a system on chip (SoC) 1006 which may include multiple types of processing units, such as a central processing unit (CPU), a graphics processing unit (GPU), or otherwise, a communication fabric, and interfaces to memories and input/output devices. In various embodiments, SoC 1006 is coupled to external memory 1002, peripherals 1004, and power supply 1008.

A power supply 1008 is also provided which supplies the supply voltages to SoC 1006 as well as one or more supply voltages to the memory 1002 and/or the peripherals 1004. In various embodiments, power supply 1008 represents a battery (e.g., a rechargeable battery in a smart phone, laptop or tablet computer, or other device). In some embodiments, more than one instance of SoC 1006 is included (and more than one external memory 1002 is included as well). In various embodiments, one or more instances of a boot-strapped circuit in accordance with those discussed above may be implemented.

The memory 1002 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 1004 include any desired circuitry, depending on the type of system 1000. For example, in one embodiment, peripherals 1004 includes devices for various types of wireless communication, such as Wi-Fi, Bluetooth, cellular, global positioning system, etc. In some embodiments, the peripherals 1004 also include additional storage, including RAM storage, solid state storage, or disk storage. The peripherals 1004 include user interface devices such as a display screen, including touch display screens or multi-touch display screens, keyboard or other input devices, microphones, speakers, etc.

As illustrated, system 1000 is shown to have application in a wide range of areas. For example, system 1000 may be utilized as part of the chips, circuitry, components, etc., of a desktop computer 1010, laptop computer 1020, tablet computer 1030, cellular or mobile phone 1040, or television 1050 (or set-top box coupled to a television). Also illustrated is a smartwatch and health monitoring device 1060. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 1000 may further be used as part of a cloud-based service(s) 1070. For example, the previously mentioned devices, and/or other devices, may access computing resources in the cloud (i.e., remotely located hardware and/or software resources). Still further, system 1000 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 10 is the application of system 1000 to various modes of transportation. For example, system 1000 may be used in the control and/or entertainment systems of aircraft, trains, buses, cars for hire, private automobiles, waterborne vessels from private boats to cruise liners, scooters (for rent or owned), and so on. In various cases, system 1000 may be used to provide automated guidance (e.g., self-driving vehicles), general systems control, and otherwise. These any many other embodiments are possible and are contemplated. It is noted that the devices and applications illustrated in FIG. 10 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure I.e., something physical))). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus comprising:
a first transistor coupled to a switching node and further coupled to receive a supply voltage from a supply voltage node;
a second transistor coupled between the switching node and a ground node, wherein the first and second transistors are of a same type;
a precharge circuit configured to precharge a gate terminal of the first transistor to a voltage that is less than the supply voltage on the voltage supply node;
a bootstrap circuit, wherein subsequent to precharging the gate terminal of the first transistor, the bootstrap circuit is configured to cause activation of the first transistor by charging the gate terminal of the first transistor to a voltage greater than the supply voltage; and
a control circuit configured to cause the precharge circuit to precharge the gate terminal of the first transistor and further configured to cause the bootstrap circuit to charge a capacitor concurrent with precharging the gate terminal of the first transistor, wherein the control circuit includes a timer configured to control an amount of time of precharging the gate terminal of the first transistor.

2. The apparatus of claim 1, wherein the bootstrap circuit includes:
a capacitor; and
a driver circuit configured to charge the capacitor concurrent with the precharge circuit charging the gate terminal of the first transistor.

3. The apparatus of claim 2, wherein the bootstrap circuit further includes:
a first switch and a second switch configured to couple a driver voltage generated by the driver circuit across the capacitor during charging of the capacitor;
wherein the first switch is configured to couple a first terminal of the capacitor to the gate terminal via a passgate to cause activation of the first transistor, and wherein the second switch is configured to couple a second terminal of the capacitor to the voltage supply node during activation of the first transistor.

4. The apparatus of claim 1, wherein the precharge circuit includes:
a third transistor having a source terminal coupled the voltage supply node; and
a fourth transistor having a source terminal coupled to a drain terminal of the third transistor, and a drain terminal coupled to the gate of the first transistor;
wherein the first, second, and fourth transistors are NMOS transistors, and wherein the third transistor is a PMOS transistor.

5. The apparatus of claim 1, wherein the control circuit is further configured to cause de-activation of the precharge circuit concurrent with causing the bootstrap circuit to be coupled a first terminal of the capacitor to the gate terminal of the first transistor.

6. The apparatus of claim 1, further comprising a discharge circuit coupled between the gate terminal of the first transistor and the switching node.

7. The apparatus of claim 1, further comprising a switching power converter, wherein the switching power converter includes the first transistor, the second transistor, the precharge circuit, and the bootstrap circuit, wherein the switching power converter further includes an inductor coupled between the switching node and a regulated voltage node, wherein the switching power converter is configured to operate the first and second transistors to produce a regulated output voltage on the regulated voltage node.

8. The apparatus of claim 7, wherein the switching power converter is a buck converter configured to produce the regulated output voltage at a value that is less than a value of the supply voltage.

9. A method comprising:
precharging a gate terminal of a first transistor of a circuit, wherein the first transistor is coupled between a voltage supply node and a switching node and wherein the circuit further includes a second transistor coupled between the switching node and a ground node, wherein the first and second transistors are both NMOS transistors, wherein precharging comprises charging the gate terminal of the first transistor to a voltage less than a voltage present on the voltage supply node;
charging a capacitor of a bootstrap circuit concurrent with precharging the gate terminal of the first transistor;
controlling, using a timing circuit, an amount of time of the precharging the gate terminal of the first transistor; and activating the first transistor, wherein activating the first transistor comprises coupling a first terminal of the capacitor to the gate terminal of the first transistor such that a voltage on the gate terminal of the first transistor is raised to a value greater than the voltage present on the voltage supply node.

10. The method of claim 9, wherein charging the capacitor comprises coupling the first terminal of the capacitor to a driver circuit and a second terminal of the capacitor to a reference node.

11. The method of claim 10, wherein activating the first transistor further comprises changing respective positions of first and second switches, wherein changing the respective position of the second switch comprises coupling the second terminal of the capacitor to the voltage supply node.

12. The method of claim 9, wherein precharging the gate terminal of the capacitor comprises:
activating a PMOS transistor having a source terminal coupled to the voltage supply node; and
activating an NMOS transistor coupled between a drain terminal of the PMOS transistor and a gate terminal of the first transistor, wherein activating the PMOS and NMOS transistors causes the gate terminal to be precharged to a voltage that is a threshold voltage of the NMOS transistor less than the voltage present on the supply voltage node.

13. The method of claim 9, further comprising a control circuit controlling an amount of precharging of the gate terminal of the first transistor, and further configured to cause the activating of the first transistor in response to completing of the precharging.

14. The method of claim 9, further comprising generating a regulated output voltage on a regulated output voltage node coupled to the switching node via an inductor.

15. The method of claim 14, wherein the regulated output voltage is greater than the voltage present on the voltage supply node.

16. A system comprising:
a power converter, wherein the power converter includes a first transistor coupled between an input voltage node and a switching node, a second transistor coupled between the switching node and a ground node, and an inductor coupled between the switching node and a regulated output voltage node, wherein the first and second transistors are NMOS transistors, and wherein the power converter further includes a control circuit, the control circuit including:
a precharge circuit configured to precharge a gate terminal of the first transistor to a voltage that is less than an input voltage received via the input voltage node;
a bootstrap circuit, wherein subsequent to precharging the gate terminal of the first transistor, the bootstrap circuit is configured to cause activation of the first transistor by charging the gate terminal to a voltage greater than the input voltage; and
a timing circuit configured to control an amount of time of precharging the gate terminal of the first transistor.

17. The system of claim 16, wherein the precharge circuit includes:
a third transistor having a source terminal coupled the input voltage node, wherein the third transistor is a PMOS transistor; and
a fourth transistor having a source terminal coupled to a drain terminal of the third transistor, and a drain terminal coupled to the gate of the first transistor, wherein the fourth transistor is an NMOS transistor;
wherein, when active, the precharge circuit is configured to precharge the gate terminal of the first transistor to a voltage that is less than the input voltage by a threshold voltage of the fourth transistor.

18. The system of claim 16, wherein the bootstrap circuit includes:
a capacitor;
a driver circuit configured to charge the capacitor;
a first and second switches configured to cause a driver voltage generated by the driver circuit to be applied across the capacitor during charging of the capacitor;
wherein the first switch is configured to couple a first terminal of the capacitor to the gate terminal via a passgate to cause activation of the first transistor, and wherein the second switch is configured to couple a second terminal of the capacitor to the input voltage node during activation of the first transistor.

19. The system of claim 16, wherein the power converter is a buck converter configured to provide a regulated output voltage at a value that is less than the input voltage.

20. The system of claim 16, further comprising a low side driver circuit configured to drive a gate terminal of the second transistor.

* * * * *